United States Patent
Thomas

(10) Patent No.: US 9,383,927 B2
(45) Date of Patent: Jul. 5, 2016

(54) METHOD AND SYSTEM FOR CREATING A MAPPING TABLE CACHE FROM AN INTERLEAVED SUBSET OF CONTIGUOUS MAPPING DATA FOR A STORAGE DEVICE

(71) Applicant: SanDisk Technologies Inc., Plano, TX (US)

(72) Inventor: Nicholas James Thomas, Dundee (GB)

(73) Assignee: SanDisk Technologies LLC, Plano, TX (US)

( * ) Notice: Subject to any disclaimer, the term of this patent is extended or adjusted under 35 U.S.C. 154(b) by 156 days.

(21) Appl. No.: 14/289,254

(22) Filed: May 28, 2014

(65) Prior Publication Data

US 2015/0347026 A1    Dec. 3, 2015

(51) Int. Cl.
*G06F 12/00* (2006.01)
*G06F 3/06* (2006.01)
*G11C 7/10* (2006.01)

(52) U.S. Cl.
CPC .............. *G06F 3/0611* (2013.01); *G06F 3/064* (2013.01); *G06F 3/0685* (2013.01); *G06F 2212/7201* (2013.01); *G11C 7/1072* (2013.01)

(58) Field of Classification Search
CPC ..... G06F 3/0611; G06F 3/064; G06F 3/0685; G06F 2212/7201; G06F 2212/7202; G06F 2212/7203; G11C 7/1072

USPC .......................... 711/206, 202, 203, 103, 104
See application file for complete search history.

(56) References Cited

U.S. PATENT DOCUMENTS

| | | | |
|---|---|---|---|
| 5,630,093 A | 5/1997 | Holzhammer et al. | |
| 7,975,109 B2 | 7/2011 | McWilliams et al. | |
| 8,954,656 B2 * | 2/2015 | Thomas .............. | G06F 12/0246 711/103 |
| 2007/0005929 A1 | 1/2007 | Post et al. | |
| 2015/0089134 A1 * | 3/2015 | Mukherjee .............. | G06F 15/78 711/114 |
| 2015/0278091 A1 * | 10/2015 | Wilkerson ................. | G06F 3/06 711/105 |

OTHER PUBLICATIONS

U.S. Appl. No. 13/773,946, filed Feb. 22, 2013 (34 page).

* cited by examiner

*Primary Examiner* — Hong Kim
(74) *Attorney, Agent, or Firm* — Brinks Gilson & Lione

(57) ABSTRACT

A method and system are disclosed for handling logical-to-physical mapping in a storage device. The method includes the storage device storing in fast access memory, such as DRAM, only a fixed-size subset of the primary mapping table in non-volatile memory, along with contiguity information of physical addresses for logical address not in the subset that are adjacent to the logical addresses in the subset. The system includes a storage device having volatile memory, non-volatile memory and a controller in communication with the volatile and non-volatile memory that is configured to carry out the method noted above.

21 Claims, 8 Drawing Sheets

METHOD AND SYSTEM FOR CREATING A MAPPING TABLE CACHE FROM AN INTERLEAVED SUBSET OF CONTIGUOUS MAPPING DATA FOR A STORAGE DEVICE

TECHNICAL FIELD

This application relates generally to a method and system for managing the mapping of data in a data storage device.

BACKGROUND

Non-volatile memory systems, such as flash memory, are used in digital computing systems as a means to store data and have been widely adopted for use in consumer products. Flash memory may be found in different forms, for example in the form of a portable memory card that can be carried between host devices or as a solid state disk (SSD) embedded in a host device. In SSDs or similar storage devices, a fine granularity logical-to-physical address mapping table is often helpful to provide improved performance. This table can typically be very large. The full table, or subparts of it, is generally necessary to perform read and write tasks, so it is desirable to store a working copy of the mapping table in fast access memory such as dynamic random access memory (DRAM) to ease read and write overhead. However, it may not be economically or technologically viable to use a DRAM sufficiently large to hold the entire table for a memory system.

If the entire mapping table is not held in DRAM, then read and write performance may slow down. For example, when data is written to a flash memory of a SSD, the mapping table or other data structure that tracks the location of data in the flash memory must be updated. The time involved in updating data structures for file systems to reflect changes to files and directories, and accessing these data structures, may affect the performance of the storage device.

Two broad types of mapping tables exist: a fixed-size entry mapping table and a variable-length entry mapping table. The former is often easier to implement and allows a direct address lookup. The latter, in the best cases, gives a reduced mapping table size but can lead to a larger mapping table size in worst case data fragmentation situations. A hybrid format maybe possible, however any method containing a variable-length entry implementation generally adds significantly to the complexity due to memory allocation required for contraction and expansion of the mapping table.

The mapping table types above can only ever guarantee a maximum mapping table size directly related to the data mapping granularity. If the DRAM is not big enough to hold this, as is generally the case, then a mechanism is required to swap in and out areas of the mapping table from flash to DRAM and vice versa. A drawback to such a scheme is evident during random workloads when large fractions of the time the mapping table for the requested data will not be stored in DRAM thus extra flash reading to access the needed portions of the table is required. A variable length copy of the mapping table in DRAM can overcome this if the fragmentation is low, but at the cost of greater algorithmic complexity which may be amount to more loss in performance than is gained by reducing the required flash reads.

BRIEF SUMMARY

In order to address the problems and challenges noted above, a system and method for handling logical-to-physical mapping in a flash memory system is disclosed. Aspects of the disclosed system and method are intended to improve the effectiveness of a fixed-size DRAM that holds less than an entirety of a primary mapping table, and thus improve read and write performance for long run lengths.

According to a first aspect, method is disclosed where, in a memory device having a non-volatile memory, a volatile memory and a controller in communication with the non-volatile memory and the volatile memory, the controller maintains a primary mapping table in the non-volatile memory, where the primary mapping table includes a logical to physical mapping of data in the non-volatile memory for the logical address space handled by the memory device. The mapping data for this logical address space may be organized as a plurality of fixed length sets of logical address space, each set having logical to physical mapping information for a contiguous group of logical addresses and any physical addresses of data associated with the contiguous group of logical addresses. Each set of mapping data is further divided into a predetermined number subsets, the subsets comprising a primary subset of mapping entries and at least one other subset of mapping entries. Each of the predetermined number of subsets includes mapping entries for an interleaved group of the contiguous group of logical addresses in a set with respective physical address mapping, where only the primary subset of each set includes, for each mapping entry, data regarding a contiguity of physical addresses between data associated with the primary subset and data associated with the at least one other subset. The method includes the controller copying the primary subset of mapping entries from the primary mapping table into volatile memory as a plurality of mapping table cache entries. The primary subset including an interleaved subset of logical addresses from each set, where each mapping table cache entry in the volatile memory contains physical address information for a respective one of the primary subset logical addresses and contiguity information relating to physical addresses of data associated with contiguous logical addresses adjacent to the respective one of the interleaved subset of logical addresses. The adjacent contiguous logical addresses may be a logical address from each of the other predetermined number of subsets. The method may include storing the portion of the primary mapping table in the volatile memory in response to detecting a trigger event. The method may also include determining a validity of data for physically discontiguous clusters identified in an entry of the mapping table cache based on trimmed bit information stored in the entry of the mapping table cache.

The method may include subsequently receiving a read or write command identifying logical addresses and, for each received logical address, the controller examining the mapping table cache entries to determine logical to physical mapping by returning a physical address for data associated with the received logical address without accessing the primary mapping table in non-volatile memory when the received logical address is in the interleaved subset of logical addresses in the mapping table cache. When the received logical address is not in the interleaved subset of logical addresses in the mapping table cache, but contiguity information in the mapping table cache indicates a physical address contiguity of data associated with the received logical address with data associated with a logical address in the mapping table cache, the controller may determine a physical address for the received logical address based on an offset from the logical address in the mapping table cache data having physical address contiguity without accessing the primary mapping table in non-volatile memory. In additional aspects, the method may include determining physical address information from the mapping table cache in volatile memory without retrieving further information from the primary mapping table in non-volatile memory, based only on primary subset mapping table cache entries in the mapping table cache, for received logical addresses.

According to another aspect, a storage device is disclosed. The storage device includes a non-volatile memory, a volatile memory, and a controller in communication with the non-volatile memory and the volatile memory. The controller is configured to maintain a primary mapping table in the non-volatile memory, where the primary mapping table includes a logical to physical mapping of data in the non-volatile memory. The primary mapping table contains a plurality of fixed length sets of logical address space, each set having a contiguous group of logical addresses and any physical addresses of data associated with the contiguous group of logical addresses. Each set of mapping data is further divided into a predetermined number of equal logical length subsets. The predetermined number of subsets includes a primary subset of mapping entries and at least one other subset of mapping entries, where each of the predetermined number of subsets has mapping entries for an interleaved group of the contiguous group of logical addresses in a set with respective physical address mapping. In one implementation only the primary subset of each set includes, for each mapping entry, data regarding a contiguity of physical addresses between data associated with the primary subset and data associated with the at least one other subset The controller is further configured to store a portion of the primary mapping table as a plurality of mapping table cache entries in the volatile memory, the portion including the primary subset of logical addresses from each set, where each mapping table cache entry in the volatile memory comprises physical address information for the primary subset and contiguity information relating to physical addresses of data associated with other subsets having contiguous logical addresses adjacent to the logical address for the respective mapping cache entry of the primary subset.

Other embodiments are disclosed, and each of the embodiments can be used alone or together in combination. The embodiments will now be described with reference to the attached drawings.

BRIEF DESCRIPTION OF THE DRAWINGS

FIG. 5A is a section of the interleaved mapping address entries shown in FIG. 5.

DETAILED DESCRIPTION

Figure 1:
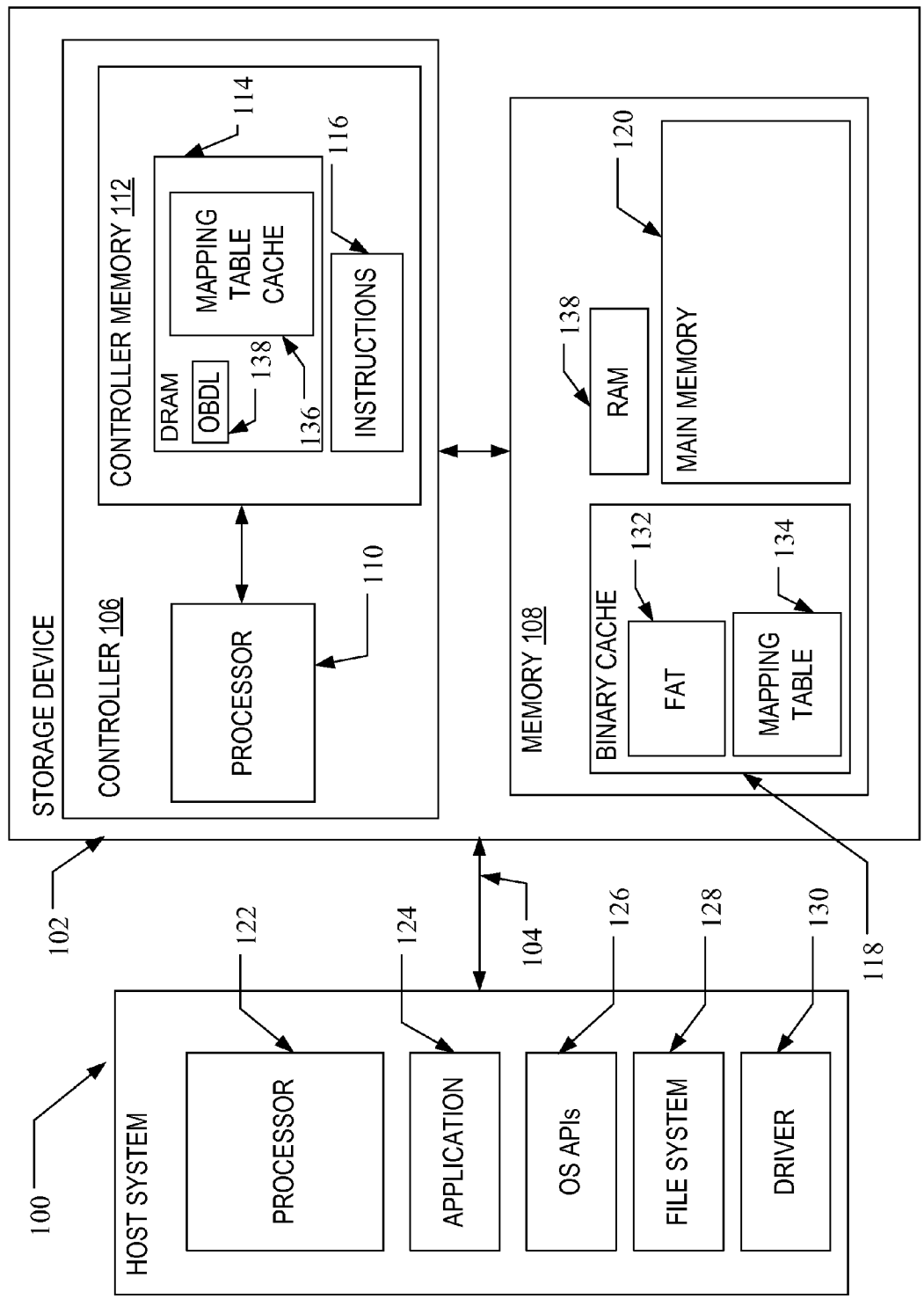
FIG. 1 illustrates a block diagram of host and storage device according to one embodiment.

A flash memory system suitable for use in implementing aspects of the invention is shown in FIG. 1. A host system 100 stores data into, and retrieves data from, a storage device 102. The storage device 102 may be embedded in the host system 100 or may exist in the form of a card or other removable drive, such as a solid state disk (SSD) that is removably connected to the host system 100 through a mechanical and electrical connector. The host system 100 may be any of a number of fixed or portable data generating devices, such as a personal computer, a mobile telephone, a personal digital assistant (PDA), or the like. The host system 100 communicates with the storage device over a communication channel 104.

The storage device 102 contains a controller 106 and a memory 108. As shown in FIG. 1, the controller 106 includes a processor 110 and a controller memory 112. The processor 110 may comprise a microprocessor, a microcontroller, an application specific integrated circuit (ASIC), a field programmable gate array, a logical digital circuit, or other now known or later developed logical processing capability. The controller memory 112 may include volatile memory such as dynamic random access memory (DRAM) 114 and/or non-volatile memory, and processor executable instructions 116 for handling memory management.

As discussed in more detail below, the storage device 102 may include functions for memory management. In operation, the processor 110 may execute memory management instructions (which may be resident in instructions 116 stored in controller memory 112) for operation of memory management functions. The memory management functions may control the assignment of the one or more portions of the memory 108 within storage device 102.

The memory 108 may include non-volatile memory (such as flash memory). One or more memory types may be included in memory 108. The memory may include cache storage (also referred to as binary cache) 118 and main memory (also referred to as long term memory) 120 that may be made up of the same type of flash memory cell or different types of flash memory cells. For example, the cache storage 118 may be configured in a single level cell (SLC) type of flash configuration having a one bit per cell capacity while the long term storage 120 may consist of a multi-level cell (MLC) type flash memory configuration having two or more bit per cell capacity to take advantage of the higher write speed of SLC flash and the higher density of MLC flash. Different combinations of flash memory types are also contemplated for the cache storage 118 and long term storage 120. Additionally, the memory 108 may also include volatile memory such as random access memory (RAM) 138.

The binary cache and main storage of memory 108 include physical blocks of flash memory that each consists of a group of pages, where a block is a group of pages and a page is a smallest unit of writing in the memory. The physical blocks in the memory include operative blocks that are represented as logical blocks to the file system 128. The storage device 102 may be in the form of a portable flash drive, an integrated solid state drive or any of a number of known flash drive formats. In yet other embodiments, the storage device 102 may include multiple types of flash memory each having one or more partitions, or only a single type of flash memory having one or more partitions.

Figure 2:
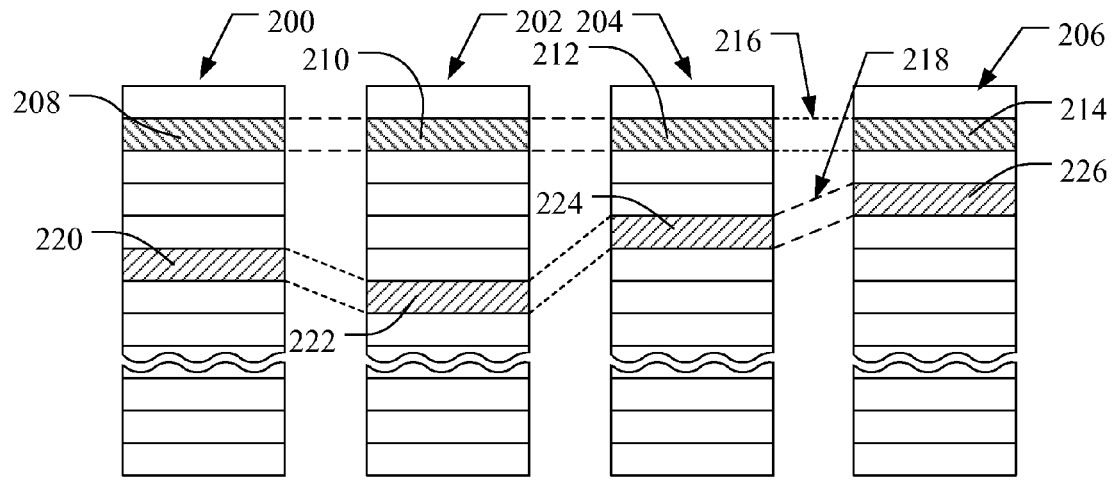
FIG. 2 illustrates an example physical memory organization of the memory in the storage device of FIG. 1.

Referring to FIG. 2, the binary cache and main memories 118, 120 (e.g. SLC and MLC flash respectively) may be arranged in blocks of memory cells. In the example of FIG. 2, four planes or sub-arrays 200, 202, 204 and 206 memory cells are shown that may be on a single integrated memory cell chip, on two chips (two of the planes on each chip) or on four separate chips. The specific arrangement is not important to the discussion below and other numbers of planes may exist in a system. The planes are individually divided into blocks of memory cells shown in FIG. 2 by rectangles, such as blocks 208, 210, 212 and 214, located in respective planes 200, 202, 204 and 206. There may be dozens or hundreds of blocks in each plane. Blocks may be logically linked together to form a metablock that may be erased as a single unit. For example, blocks 208, 210, 212 and 214 may form a first metablock 216. The blocks used to form a metablock need not be restricted to the same relative locations within their respective planes, as is shown in the second metablock 218 made up of blocks 220, 222, 224 and 226.

Figure 3:
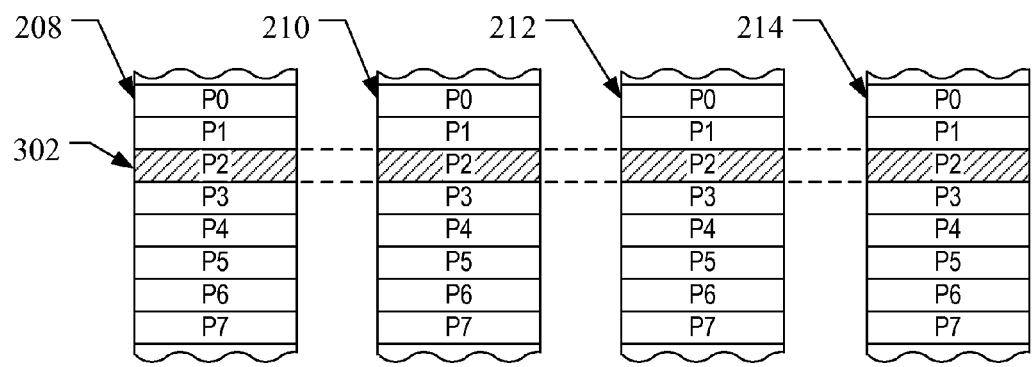
FIG. 3 shows an expanded view of a portion of the physical memory of FIG. 2.

The individual blocks are in turn divided for operational purposes into pages of memory cells, as illustrated in FIG. 3. The memory cells of each of blocks 208, 210, 212 and 214, for example, are each divided into eight pages P0-P7. Alternately, there may be 16, 32 or more pages of memory cells within each block. A page is the unit of data programming and reading within a block, containing the minimum amount of data that are programmed or read at one time. A metapage 302 is illustrated in FIG. 3 as formed of one physical page for each of the four blocks 208, 210, 212 and 214. The metapage 302 includes the page P2 in each of the four blocks, but the pages of a metapage need not necessarily have the same relative position within each of the blocks. A metapage is the maximum unit of programming. The blocks disclosed in FIGS. 2-3 are referred to herein as physical blocks because they relate to groups of physical memory cells as discussed above. As used herein, a logical block is a virtual unit of address space defined to have the same size as a physical block. Each logical block includes a range of logical block addresses (LBAs) that are associated with data received from a host 100. The LBAs are then mapped to one or more physical blocks in the storage device 102 where the data is physically stored.

Referring again to FIG. 1, the host 100 may include a processor 122 that runs one or more application programs 124. The application programs 124, when data is to be stored on or retrieved from the storage device 102, communicate through one or more operating system (OS) application programming interfaces (APIs) 126 with the file system 128. The file system 128 may be a software module executed on the processor 122 and manages the files in the storage device 102. The file system 128 manages clusters of data in logical address space. Common operations executed by a file system 128 include operations to create, open, write (store) data, read (retrieve) data, seek a specific location in a file, move, copy, and delete files. The file system 128 may be circuitry, software, or a combination of circuitry and software.

Accordingly, the file system 128 may be a stand-alone chip or software executable by the processor of the host 100. A storage device driver 130 on the host 100 translates instructions from the file system 128 for transmission over a communication channel 104 between the host 100 and storage device 102. The interface for communicating over the communication channel may be any of a number of known interfaces, such as SD, MMC, USB storage device, SATA and SCSI interfaces. A file system data structure 132, such as a file allocation table (FAT), may be stored in the memory 108 of the storage device 102. Although shown as residing in the binary cache portion 118 of the memory 108, the file system data structure 132 may be located in the main memory 120 or in another memory location on the storage device 102.

In addition to the user data and host-generated file system tables that may be stored in flash memory on the storage device, the storage device 102 itself stores and maintains a primary mapping table 134 or other data structure that tracks the logical addresses supplied by the host file system 128 and the physical addresses in flash memory where the storage device 102 is keeping the data. One way to maintain a primary mapping table 134 (also referred to as a group address table or GAT) of all logical to physical address relationships in the storage device is to maintain the entire table in flash memory (such as NAND flash) and to then copy the entire table into a mapping table cache 136 (also referred to as a GAT Cache) in fast access memory such as the DRAM 114 in the controller 106 of the storage device 102. In some storage device architectures a limited amount of DRAM 114 is available, where the DRAM space is needed both to cache data written to or read from the NAND flash and to handle mapping table data, and the DRAM 114 is not big enough to hold the entire mapping table 134. When the DRAM is not big enough to hold a complete copy of the mapping table that is in non-volatile memory, then a mechanism is necessary to swap portions of the mapping table in and out of DRAM. This can be slow and may need greater algorithmic complexity to implement.

Figure 4:
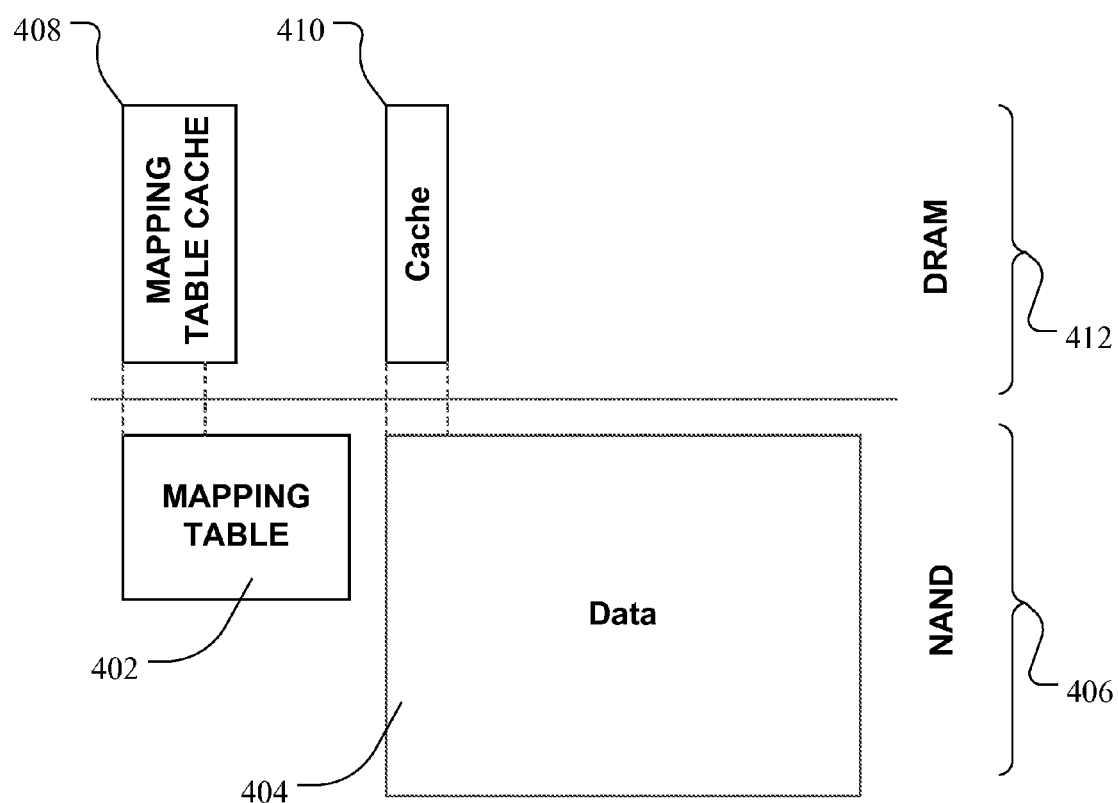
FIG. 4 illustrates an embodiment of a storage device having a selected portion of a mapping table stored in DRAM as a mapping table cache.

In order to utilize a fixed-size DRAM that is not sufficient to hold the entirety of the mapping table maintained in flash, a method and system for storing in DRAM interleaved portions of the mapping table in NAND flash are now described. The interleaved portions include information on physical address continuity of LBA runs in the adjacent portions of the full table from NAND flash that are not included in the DRAM interleaved portions. As shown in FIG. 4, in this architecture the complete mapping table 402 (which may be the same as mapping table 134) and user data 404 mapped by the mapping table 402 are contained in NAND flash 406. The mapping table 402 may contain all of the LBA addresses, where the LBA addresses are divided into a number of sets of sequentially numbered LBA addresses and associated physical block addresses. Each set of LBA addresses may then be subdivided into interleaved subsets and only certain of those subsets may be copied into the mapping table cache 408 (also referred to as a DRAM address table or DAT). Both the mapping table cache 408 and certain amounts of cached data 410 share the space available in DRAM 412 or other fast access memory.

In one embodiment, the logical to physical mapping scheme implemented by the controller 106 of the storage device 102 will manage mapping data by dividing the logical address space into equal length sets of data having equal length subsets. The mapping entries in the primary mapping table preferably include not only the standard logical to physical mapping data that associates each logical block address with a physical block address for any valid data associated with the LBA, but also includes contiguity information regarding the presence or absence of physical address contiguity between contiguous logical addresses in adjacent subsets of each set.

Figure 5:
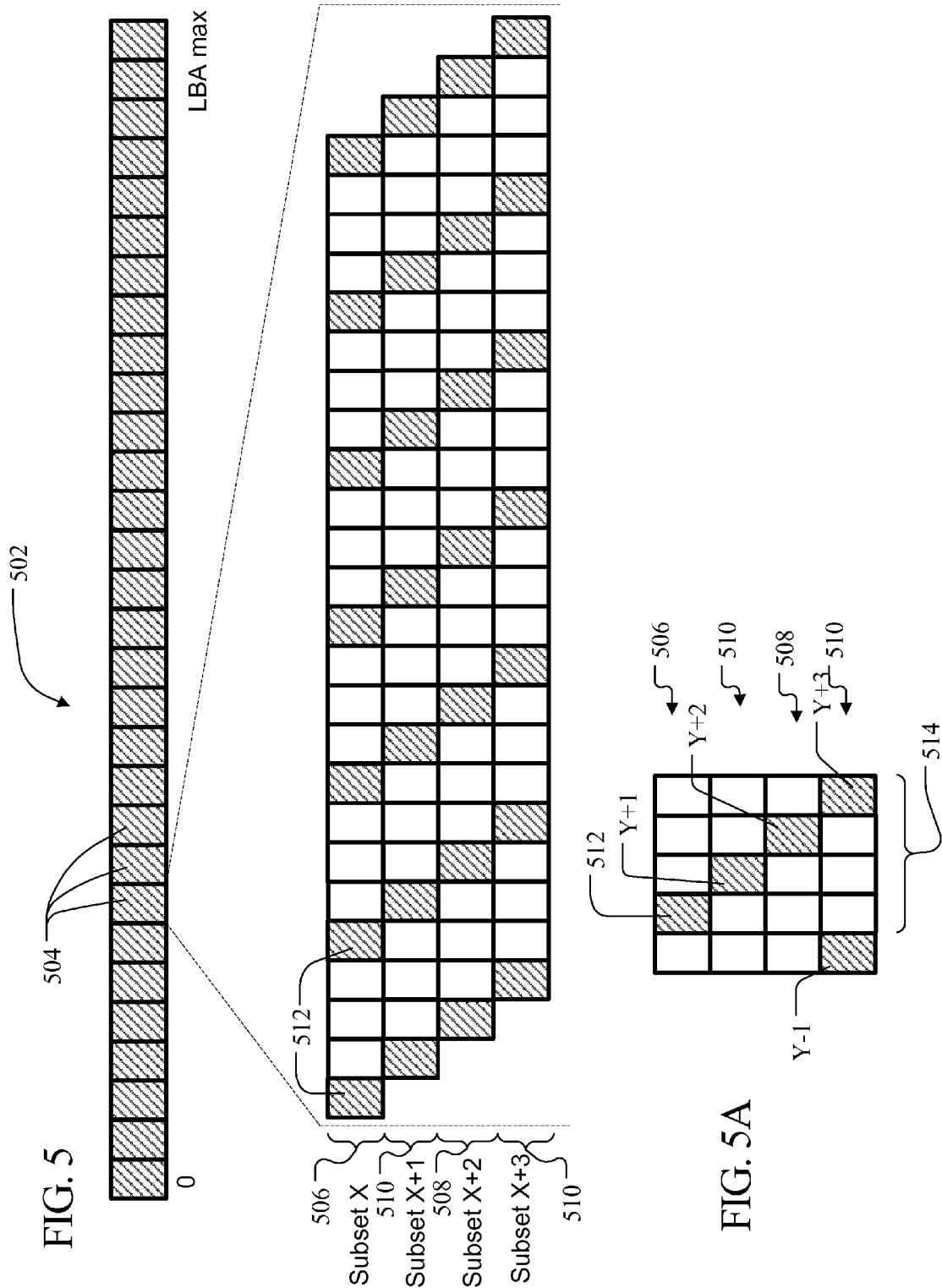
FIG. 5 illustrates an example logical block address mapping space of a storage device divided into sets, where each set is further divided into subsets of interleaved mapping address entries according to one embodiment.

Referring to FIG. 5, an example of a complete LBA address range 502 (from address 0 through address $LBA_{max}$) the storage device 102 can handle is shown. The LBA address range 502 may be fully mapped in the mapping table 402 maintained in non-volatile memory 118, such as NAND flash 406. The LBA address range 502 is divided up into a predetermined number of equal-sized sets 504 and each of the sets 504 may be divided into an equal number of interleaved subsets 506, 508, 510. Each of the subsets 506, 508, 510 is an interleaved collection of the cluster entries. As used in this description, a cluster is defined as the minimum addressable unit that the mapping tables can manage. A cluster is typically larger than an amount of data identified by an LBA, but a cluster may also be as small as an LBA in some implementations. Although it may vary in different implementations, data is generally written to memory at a cluster granularity and can be read from memory in LBA granularity. In the example of FIG. 5, there are 4 subsets 506, 508, 510 per set 504 and each subset has a cluster entry for every $4^{th}$ cluster, starting at a different offset. Thus, in the example of FIG. 5 where there are four subsets 506, 508, 510 per set 504, the first subset 506 (subset X), also referred to herein as the primary subset, has an interleave factor of 4 with no offset and so includes clusters 508 0, 4, 8, 12 and so on from the set 504. For purposes of the discussion below, the third subset 508 (subset X+2) is referred to herein as the secondary subset and has an offset of 2, and the second and fourth subsets 510 (subset X+1 and subset X+3) are referred to as tertiary subsets and have offsets of 1 and 3, respectively.

Figure 6:
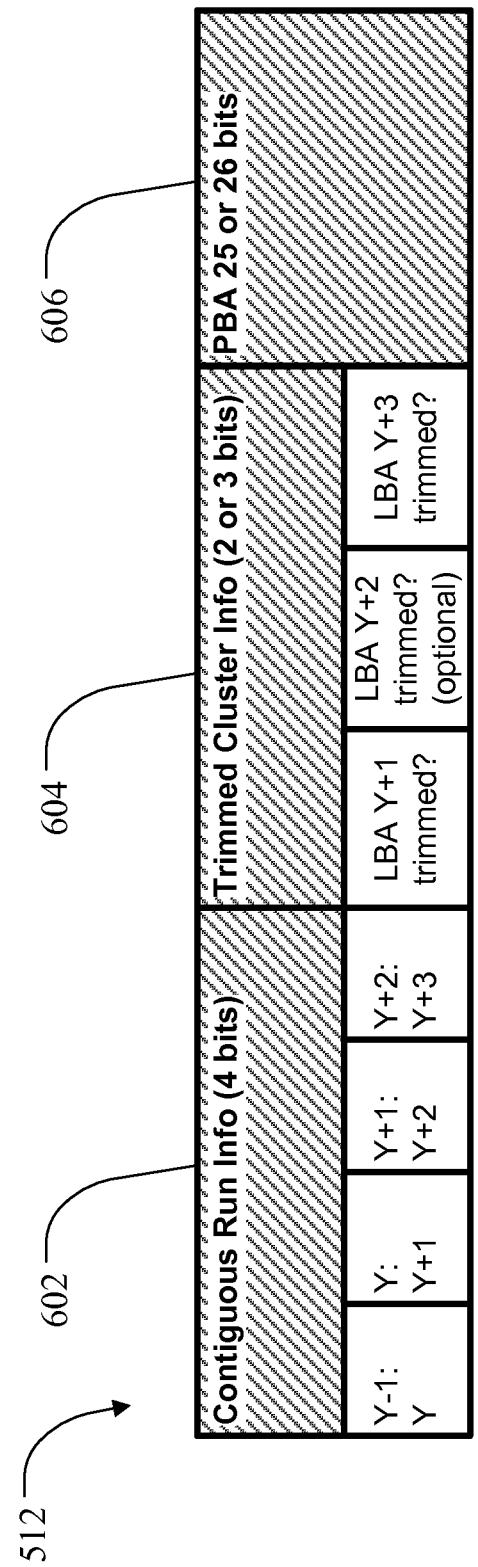
FIG. 6 illustrates an example of a primary subset mapping entry format for the mapping entries of the primary subset of FIG. 5.

Referring to FIGS. 5A and 6, one implementation of a cluster entry format in the primary subset (subset X) 506 is illustrated. FIG. 5A shows a slice of the sequential cluster entries from each of the four subsets 506, 508, 510 of FIG. 5 illustrating a cluster group 514 of 4 sequential cluster entries that include the entries for the primary cluster 512, tertiary cluster (Y+1), secondary cluster (Y+2) and tertiary cluster (Y+3), along with the immediately preceding tertiary cluster (Y−1) from the prior cluster group. As illustrated in FIG. 6, rather than simply including standard logical-to-physical mapping data 606 of LBA to physical block address (PBA), each cluster mapping entry 512 for the primary subset 506 also includes contiguous run information 602. The contiguous run information 602 refers to the contiguity in the physical block address space associated with the logical cluster that precedes, and the three next logical clusters that follow, the cluster associated with the current primary cluster entry 512. More specifically, in the example primary subset cluster entry 512 of FIGS. 5A and 6, for a cluster at LBA Y where there is a 4 subset division of each set 504 (and a cluster address interleave factor of 4 in each subset), the contiguous run information 602 in the entry 512 tracks the contiguity of the prior logically addressed cluster (Y−1:Y), and each of the three clusters following the current cluster (Y:Y+1, Y+1:Y+2, and Y+2:Y+3). In one embodiment, if the physical block addresses of the preceding cluster (Y−1) and remaining clusters (Y+1, Y+2 and Y+3) of the cluster group 514 are contiguous due to a contiguous run, then each of the four bits in the contiguous run information section 602 of the entry 512 would be set to a "1" (assuming "0" is indicative of a non-contiguous physical address).

In instances where one or more of the prior cluster Y−1 (which would be the cluster with the next lower LBA and found in the second of the tertiary subsets 510 (e.g., Subset X+3)) or next three subsequent clusters (the next three subsets—tertiary 510, secondary 508 and tertiary 510) were not contiguous with their neighboring clusters, that bit would then be set to "0". The value of the designated contiguous or non-contiguous bit may be different in different embodiments. In instances where the primary subset 506 indicates that the data for LBAs in cluster Y is contiguously written with physical block addresses for LBAs in clusters Y−1, Y+1 and Y+2 and Y+3, then an address lookup in the DRAM 114 of the primary subset 506 may be sufficient without the storage device 102 needing to access further mapping subset data for the secondary or tertiary subsets 508, 510 in the primary mapping table 134 in non-volatile memory 108.

In addition to contiguous run information 602 for the prior cluster Y−1 (last cluster in the prior subset) and the remaining three clusters Y+1, Y+2, Y+3 of the cluster group 514 (in the set 504 that the primary subset 506 resides in), trimmed cluster information 604 for the remaining three clusters in the set may be tracked. A "trimmed" cluster refers to a cluster that has never been written to or one that contains data that is no longer valid (which may not have been erased). Storing the trimmed cluster information as a single bit for each of the adjacent clusters can prevent unnecessary lookups in the full mapping table in non-volatile memory if the contiguity bits indicate that any data at the LBA is not physically contiguous with LBA Y. If no valid data exists at the next LBA address for the discontiguous physical location, a lookup operation for the physical address in the full mapping table in non-volatile memory is unnecessary. In one embodiment, the trim information in each primary subset entry 512 may include trim information for all three of the remaining cluster entries Y+1, Y+2, and Y+3 in the cluster group 514. Specifically, the trim information would be the trim status of the next cluster in the first tertiary subset (subset X+1 510), the secondary subset (subset X+2 508), and the second tertiary subset (subset X+3 510)). In other embodiments, because retrieving mapping data from the primary mapping table in non-volatile memory for clusters in the tertiary subsets 510 tends to require more resources than clusters in the secondary subset 508, only trim information for the two tertiary subsets 510 (subset X+1 and subset X+3) may be stored if there are not enough spare bits to handle trim status bits for all the subsets.

Figure 7:
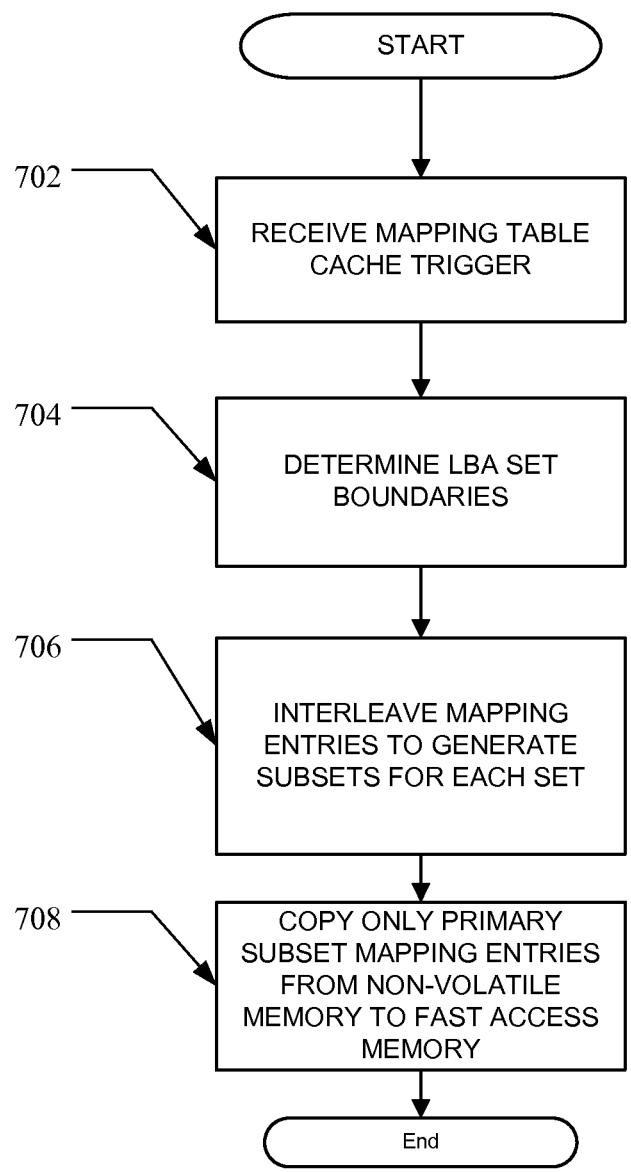
FIG. 7 is a flow diagram of a method for generating a mapping table cache in DRAM from the primary mapping table in non-volatile memory with the interleaved address entries of a primary subset of the mapping table.

Referring to FIG. 7, the controller 106 of the storage device 102 may generate and update the mapping table cache 136 at any of a number of times. A trigger event, such as a detected power up of the storage device or a predefined point during an initialization of the storage device 102, may cause the controller to begin assembling the mapping table cache 136 (at 702). The primary mapping table 134 in non-volatile memory preferably is maintained by the controller 106 such that it already includes the interleaved mapping table format with primary, secondary and tertiary subset entries. The primary subset data is maintained with contiguity bits and trim bits as well as logical to physical address mapping for the primary subset clusters, while the secondary and tertiary subset cluster entries may be maintained in the traditional logical to physical mapping format without separate contiguity or trim bits in those entries.

Upon identifying a predefined mapping table cache trigger event, the controller may, based on the LBA set boundary information and subset interleave factor information that may be predetermined and stored in the instructions 116 of the controller memory 112 or in non-volatile memory 108 (at 704), copy entries 512 for the primary subset 506 from the primary mapping table 134 to the mapping table cache 136 in the format as described above (at 706). In the example of FIGS. 5-6, there are four subsets per set, so the interleave factor would be set to four and every fourth cluster entry 512 would have an entry copied for the primary subset 506 as illustrated in FIGS. 5-6. Although the controller 106, in one embodiment, would then copy only the data for primary subset mapping entries 512 from non-volatile memory into the mapping table cache 408 in fast access memory (at 708), if there is more room available then other entries for secondary or tertiary mapping information may also be copied over. As illustrated in FIGS. 1 and 4, the fast access memory may be DRAM 114, 412 and the non-volatile memory may be NAND flash 118, 120, 406, however other combinations of memory types are also contemplated. Additionally, in other embodiments the interleave factor may be greater than or less than the example interleave factor of four provided.

In order to create the interleaved cluster address mapping entries for the primary subset as noted above, the primary mapping table 134 in non-volatile memory 118 preferably includes contiguity information identifying whether there is the physical block address (PBA) contiguity for the data corresponding to sequential clusters (e.g. for sequential LBAs). Although it is contemplated that physical address contiguity could be determined on the fly when the mapping table cache is generated, it is preferred that the PBA contiguity information 602 be already determined and stored with the LBA information in the primary mapping table 134. In this manner, the logical to physical mapping and the contiguity information may be simply copied from non-volatile memory into the entries of the primary subset that are stored in the mapping table cache in DRAM.

As a result of including PBA contiguity information 602 between clusters 512 in the primary subset 506, other subsets 508, 510 for the same set 504 and the cluster 512 in the second tertiary subset 510 of the prior set as set forth in the example entry format of FIG. 6, there may be an improved probability of finding the PBA mapping information for contiguous runs of data through the use of only the primary subset mapping information that is in DRAM 114. In such a situation, there is no need to either perform a lookup operation in the full mapping table in non-volatile memory, or to swap out portions of mapping data from the DRAM to make room for other mapping data from the primary mapping table in the limited space of the DRAM 114. Also, the interleaved cluster mapping entries 512 (every $4^{th}$ cluster in the example of the primary subset in FIGS. 5-6), may improve the chances that an address lookup in the mapping table cache 136 will result in a successful lookup. It is contemplated that, in one implementation, all of the primary subset entries 512 will be copied and stored into the fast access memory, such as the DRAM 114 shown in FIG. 1. In other implementations, it may not be as efficient but still may prove effective to include less than all the primary subset entries in DRAM.

Figure 8:
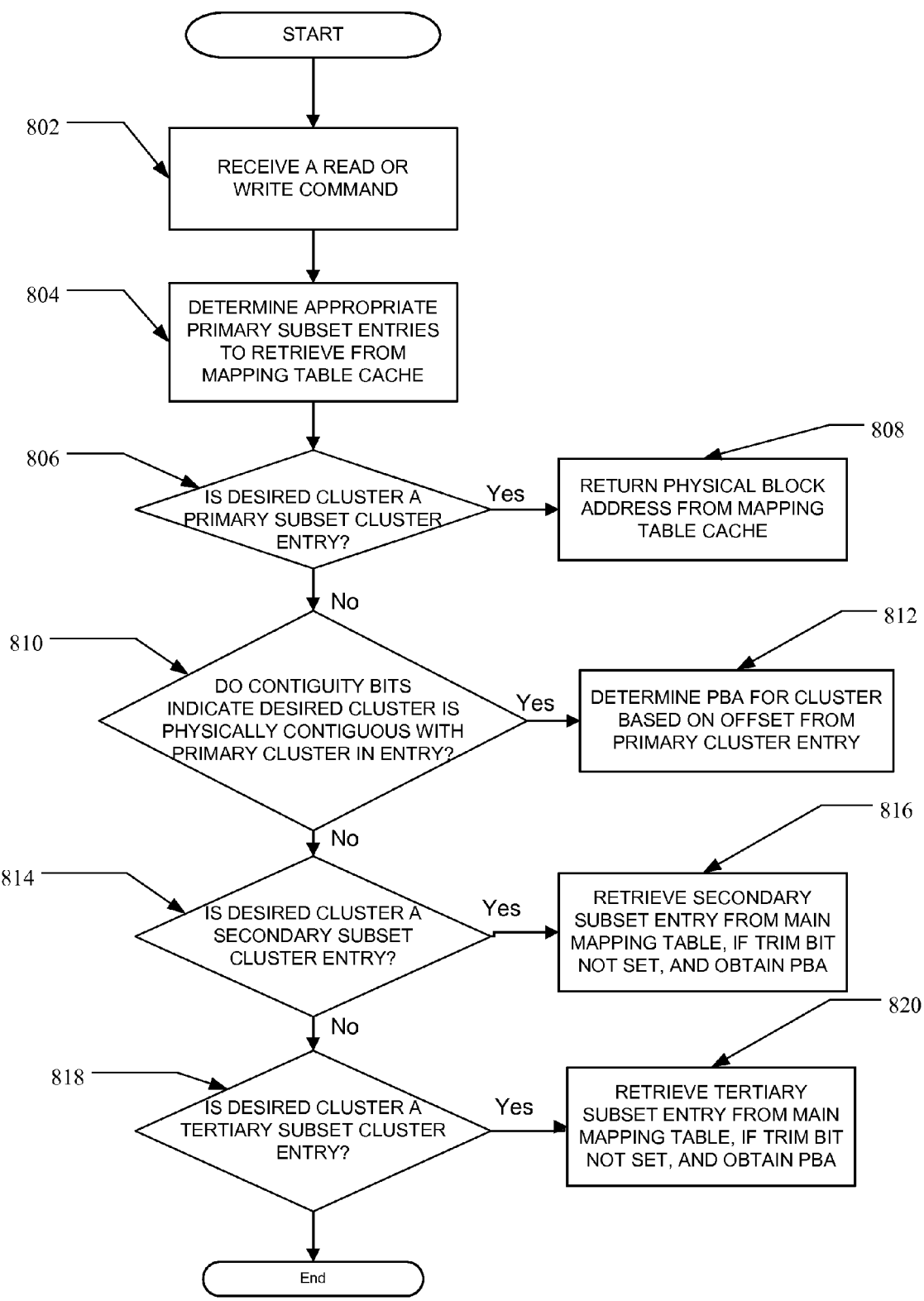
FIG. 8 is a flow diagram of an embodiment of an address translation performed using the primary subset address entries in DRAM such as address mapping entries in the format illustrated in FIG. 6.

Referring now to FIG. 8, an embodiment is disclosed of a method of performing address translation implementing a fixed-size mapping table cache storing primary subset mapping entries as discussed above. Address translation is used for host reads (when a user is requesting his or her data) or during some control updates (e.g., during a write operation). To address translate (i.e., evaluate the physical location of a logical cluster), the mapping table cache in DRAM is first read as described below. If the physical block address cannot be found in the mapping table cache after executing the steps below, then it must be read separately from the primary mapping table in non-volatile memory.

The address translation technique involves first receiving a read or write command indicating a LBA address range (at 802). The controller then compares the received address range with the primary subset entries in the mapping table cache in DRAM to determine the appropriate primary subset entry to look at (at 804). For example, the lowest logical block address of the read or write may be compared to the logical block addresses of the mapping entries for the appropriate primary subset and, if the cluster being evaluated in the read or write command is within the primary subset, then the physical block address (PBA) is returned (at 806, 808).

Alternatively, if the desired cluster entry is for an adjacent cluster covered by the contiguity information in the primary subset entry being examined, and the contiguity information bit or bits are set (i.e., indicating that the physical addresses are sequential for the sequential logical addresses) for the desired cluster or desired LBA in a cluster, then there is no need to examine trimmed cluster bits because you already know the data is part of a run and it is assumed to be valid (at 810). In an alternative embodiment, the trim data bits could be checked rather than the contiguity bits to see if a secondary or tertiary cluster entry should be retrieved. If the trimmed cluster bits are set (i.e., indicating that the data at the physical address associated with the adjacent logical address is not valid), then there would be no need to look at the contiguity bits to see whether or not the data was at a contiguous physical block address.

If the contiguous run bits within the primary subset entry indicate that the desired cluster (secondary or tertiary) is physically contiguous with the primary cluster, then the physical block addresses are determined from that primary subset entry by adjusting for the offset within the entry (e.g. by looking at the offset address in the contiguous logical space and counting over the same number of addresses from the physical address associated with the primary cluster entry in the contiguous physical address space) (at 812). Otherwise, if the address is for a secondary cluster that is not physically contiguous with the primary cluster, then the secondary subset entry may be read from the primary mapping table in non-volatile memory to determine the physical block address (PBA) for the desired cluster (at 814, 816). Finally, if the cluster is a tertiary subset cluster that is not physically contiguous with a primary or secondary subset entry, then the appropriate tertiary subset cluster entry can be retrieved by the controller from the primary mapping table in non-volatile memory (at 818, 820). Thus, the mapping data for the secondary and tertiary subset clusters, when not determinable from the primary or secondary subset cluster information, may require a mapping table look-up in non-volatile memory.

Alternatively, if additional room for subset entries aside from primary subset entries is available in the DRAM, and the desired secondary or tertiary subset entry is in DRAM, then the controller may first read the non-primary subset information from the DRAM rather going to the slower process of reading directly from the full mapping table in non-volatile flash memory. In yet other embodiments, if a more recent update of mapping table information is available for the desired cluster in another temporary address list maintained in the storage device and has not yet been consolidated with the primary mapping table in non-volatile memory or the mapping table cache in DRAM, then that temporary list or table may be read from by the controller for the desired information. Examples of such lists include open block data lists (OBDL) 138 which lists recently written data to the DRAM that may be maintained in DRAM until it is able to be written to the main address table in flash. If the desired cluster is not in the primary subset, or cannot be determined from the primary subset information (for example, because it is not listed as contiguous with a nearest primary subset entry in the cached mapping table), and is not in the secondary subset, then the tertiary subset may be read. If the tertiary subset is in the mapping table cache in DRAM, then it is desirable to read from the DRAM rather than go directly to the full mapping table in flash memory. As with the alternative lookup ability mentioned above with the secondary subset through lists or other temporary tables, these same lists or tables are potentially available for reading the address translation for tertiary subset entries as well.

Figure 9:
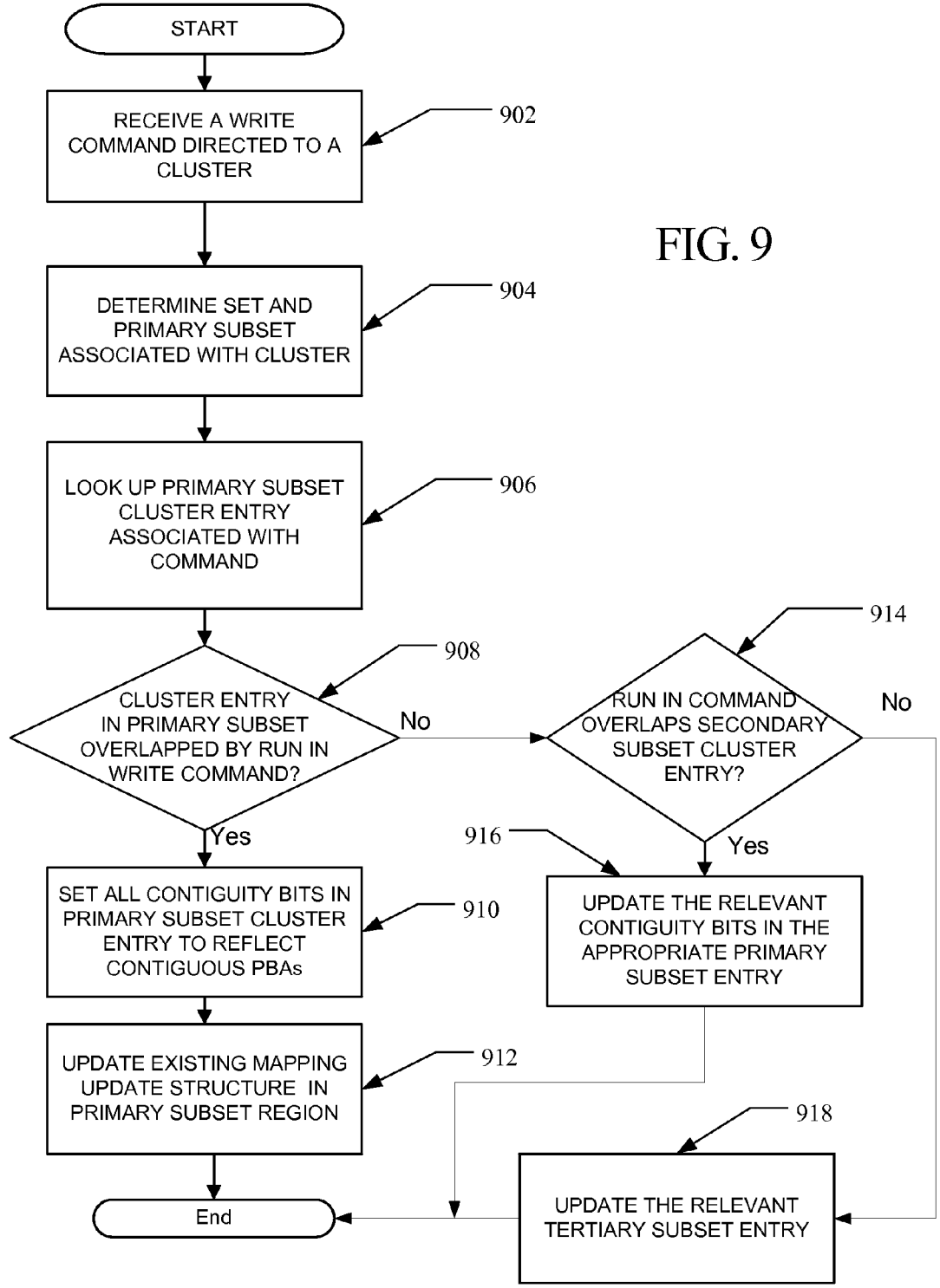
FIG. 9 is a flow diagram of an embodiment of a mapping update procedure associated with a data write using the primary subset address entries in DRAM such as address mapping entries in the format illustrated in FIG. 6.

Referring now to FIG. 9, a mechanism for updating a mapping table and mapping table cache is illustrated. In response to receiving a write command (at 902) that writes or overwrites previous data, the controller evaluates the logical address space to determine the set and primary subset that contains the run (at 904). The controller then reads the appropriate primary subset entry stored in the mapping table cache in fast access memory (DRAM) (at 906). If the run straddles the cluster in the primary subset, then the physical block address field in the primary subset entry is adjusted and the contiguous run bits are set to 1 (indicating contiguity) for all clusters in the run (at 908, 910). The newly written run may also be concurrently written to the existing update structure, such as the open block data list (OBDL) in the primary subset region only (at 912).

Alternatively, if the new run that is being written to memory straddles the cluster in the secondary subset, then the run is added to the OBDL list only. The contiguous run field bits in the primary subset entry may be adjusted accordingly and, if the secondary subset entry is also in the fast access memory, then the physical block address field of the secondary subset will be adjusted (at 914, 916). If the cluster update is not found in the primary subset or the secondary subset, then it must be a single cluster run (in this example of a four subset arrangement per set) and the single cluster must then be within one of the tertiary subsets. In the update structure, such as the OBDL 138, within the corresponding tertiary subset region only is updated and, if the tertiary subset is within the fast access memory, its physical block address field will also be updated (at 914, 918). Thus, updates to the mapping table information are preferably made to the primary subset in DRAM and, then to the secondary subset if it cannot be made in the primary subset, and finally in the appropriate tertiary subset if it cannot be done in either the primary or tertiary subsets.

Updating address tables using the mapping table subset arrangement described above, where the only subset typically stored in fast access memory is the primary subset, may be more challenging where a new run of data overwrites part of a previous run and leads to updates of the primary or secondary subsets. If a new run overwrites part of a previous run updating a primary or secondary subset, it may possibly delete information about an entry in the secondary subset or tertiary subsets because it would have only been written to the primary or secondary subset. Or, in this case, which can be detected by analyzing the contiguous run bits in the primary subset, the mechanism for updating the address table may include recreating the run to the secondary or tertiary subset region ensuring that this run gets committed to flash (the primary mapping table in non-volatile memory) before the primary subset gets consolidated. Otherwise, there may be no record in the flash of the partially overwritten run. Other adjustments that may be made to prevent issues with overwriting of a previous update run to a primary or secondary subset may be to never consolidate a primary subset containing partially overwritten runs prior to receiving information from the OBDL. In an alternative embodiment, the controller may always consolidate tertiary and secondary subset regions before their corresponding primary subset if those tertiary and secondary subset regions contain partially overwritten runs. A copy of the updated primary subset information in DRAM may then be backed up in flash memory.

A system and method for reducing the need to swap pieces of mapping information, and for operating with a fixed-size cached mapping table, in a DRAM or other fast action memory has been disclosed. In one implementation, the method includes dividing the logical address space of the mapping table into equal sized sets of logical block addresses and then, within each set, interleaving address information to create multiple subsets for each set so that the mappings within each subset are no longer contiguous. The interleaved subset mapping information is maintained in full in the primary mapping table in non-volatile memory and the primary subset mappings, where the primary subset entries include contiguity and trim information for adjacent logical clusters while secondary and tertiary entries do not, and the primary subset entries are copied from the primary mapping table in non-volatile memory to the mapping table cache in volatile memory. Although the interleave structure has been disclosed with an interleave factor of four in the specific examples above, any of a number of other interleave sizes may be used.

As discussed above, one of the subsets within the set is termed the primary subset and the other subsets are termed secondary and tertiary subsets. The primary subset contains enough information to ascertain whether it is necessary to read the secondary or tertiary subsets within the set or adjacent sets. The sets of information may be contained within spare bits within a primary subset mapping entry such as the entry format shown in FIG. 6. Spare bits may include contiguity information for physical addresses which are contiguous for consecutive logical addresses, and/or trimmed data information showing where their valid data exists for a particular cluster. In one embodiment, only the primary subset mapping entry format stores information in spare bits including contiguity information relating to physical addresses of adjacent logical clusters, and including trimmed data status for the adjacent logical clusters.

The interleaved subset mapping entries discussed above, where the primary subset for each of the sets is stored in fast access memory as a mapping table cache, may increase read and write performance. For low fragmentation workloads where reads and writes have longer contiguous physical runs of data, the method and system disclosed may provide better performance than for random, highly fragmented (discontiguous) data runs. For example if the granularity of mapping data is 1 cluster having a 4 kilobyte size, then for contiguous cluster runs of 8 kilobytes and above, address lookups in the mapping table cache comprising only primary subset mapping data entries with contiguity and trim data may increase the "hit rate" for finding the desired addresses without the need to look at the primary mapping table in non-volatile memory. The possible reduction in DRAM space that this technique may provide may be understood in the following example.

In a 16 gigabyte (Gb) storage device, if the total LBA address space in the primary mapping table required 16 megabytes of address space, and the interleave factor of four was used as disclosed in FIGS. 5 and 6, then each subset (for all of one type of subset (e.g. the primary subset) in all the sets) of mapping address information would be 4 megabytes. At 4 kilobytes per address cluster, there would then be 1,000 clusters in the subset and the DRAM needed to hold the primary subset mapping entries would only need to be 4 megabytes for the 16 gigabyte storage device In implementations where the interleave factor for the subset entries is 4, such that there are 4 subsets per set and each subset has mapping data for every $4^{th}$ cluster (starting at a different offset), the size of the mapping table cache will be essentially ¼ the size of the primary mapping table in non-volatile memory, as it contains only the primary subset mapping entries. Also, because the primary subset entries are not compressed, there is no compression algorithm needed to interpret mapping information that might otherwise lessen the processing speed benefit gained by having the mapping information in DRAM. Instead of dedicating larger amounts of DRAM to a mapping table cache, the primary subset mapping entries with added contiguity and trim information for adjacent clusters allow efficient address translation and table updates.

A system and method has been disclosed for reducing the amount of a mapping table necessary in DRAM while improving the likelihood of finding logical-to-physical mapping information in DRAM rather than using a lookup operation in complete mapping table in non-volatile memory such as NAND flash. The disclosed system and method may be implemented in systems where the DRAM or volatile memory is too small to hold a complete copy of the entire primary mapping table maintained in non-volatile memory and can help avoid the need to swap out different portions of the primary mapping table by providing enough information in the primary subset of mapping entries to help determine physical addresses for logical addresses that do not have mapping entries copied into the mapping table cache.

The methods described herein may be embodied in instructions on computer readable media. "Computer-readable medium," "machine readable medium," "propagated-signal" medium, and/or "signal-bearing medium" may comprise any device that includes, stores, communicates, propagates, or transports software for use by or in connection with an instruction executable system, apparatus, or device. The machine-readable medium may selectively be, but not limited to, an electronic, magnetic, optical, electromagnetic, infrared, or semiconductor system, apparatus, device, or propagation medium. A non-exhaustive list of examples of a machine-readable medium would include: an electrical connection "electronic" having one or more wires, a portable magnetic or optical disk, a volatile memory such as a Random Access Memory "RAM", a Read-Only Memory "ROM", an Erasable Programmable Read-Only Memory (EPROM or Flash memory), or an optical fiber. A machine-readable medium may also include a tangible medium upon which software is printed, as the software may be electronically stored as an image or in another format (e.g., through an optical scan), then compiled, and/or interpreted or otherwise processed. The processed medium may then be stored in a processor, memory device, computer and/or machine memory.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

It is therefore intended that the foregoing detailed description be regarded as illustrative rather than limiting, and that it be understood that it is the following claims, including all equivalents, that are intended to define the spirit and scope of this invention.

What is claimed is:

1. A method of managing a memory device comprising:
in a memory device having a non-volatile memory, a volatile memory and a controller in communication with the non-volatile memory and the volatile memory, the controller:
maintaining a primary mapping table in the non-volatile memory, the primary mapping table comprising:
logical to physical mapping entries in the non-volatile memory, wherein the primary mapping table comprises a plurality of fixed length sets of logical address space, each set comprising a contiguous group of logical addresses and any physical addresses of data associated with the contiguous group of logical addresses;
wherein each set is further divided into a predetermined number of subsets comprising a primary subset of mapping entries and at least one other subset of mapping entries, each of the predetermined number of subsets comprising mapping entries for an interleaved group of the contiguous group of logical addresses in a set with respective physical addresses, wherein only the primary subset of each set includes, for each mapping entry, data regarding a contiguity of physical addresses between data associated with the primary subset and data associated with the at least one other subset;
and
copying the primary subset of mapping entries from the primary mapping table into the volatile memory as a plurality of mapping table cache entries, wherein each mapping table cache entry in the volatile memory comprises physical address information for a respective one of the interleaved subset of logical addresses of the primary subset and contiguity information relating to physical addresses of data associated with adjacent contiguous logical addresses in the at least one other subset, wherein the adjacent contiguous logical addresses comprise only one logical address from each of the at least one other subset.

2. The method of claim 1, wherein copying each mapping table cache entry from the primary mapping table into the volatile memory further comprises copying trim information into the mapping table cache entries from the primary mapping table regarding at least one of the contiguous logical addresses adjacent to the respective one of the interleaved subset of logical addresses of the primary subset.

3. The method of claim 1, wherein copying the primary subset of mapping entries from the primary mapping table comprises copying a portion of the mapping entries from the primary mapping table in response to detecting a trigger event in the storage device.

4. The method of claim 3, wherein detecting the trigger event comprises detecting a power up of the storage device.

5. The method of claim 3, wherein the portion of the mapping entries from the mapping table is a fixed-size portion.

6. The method of claim 5, wherein the portion of the mapping entries comprises only the primary subset mapping entries for each set.

7. The method of claim 1, further comprising receiving logical addresses in a read or write command and, for each received logical address, the controller examining the mapping table cache entries to determine logical to physical mapping by:
when a received logical address is in a mapping table cache entry, returning a physical address for data associated with the received logical address without accessing the primary mapping table in non-volatile memory.

8. The method of claim 7, further comprising the controller examining the mapping table cache entries in volatile memory to determine logical to physical mapping by:

when the received logical address is not in the mapping table cache entries, but contiguity information in the mapping table cache entries indicates a physical address contiguity of data associated with the received logical address with data associated with a logical address in the mapping table cache, determining a physical address for the received logical address based on an offset from the logical address in the mapping table cache data having physical address contiguity without accessing the primary mapping table in non-volatile memory.

9. The method of claim 7, further comprising the controller examining the mapping table cache entries in volatile memory to determine logical to physical mapping by:

when the received logical address is not in the mapping table cache entries and contiguity information in the mapping table cache entries does not indicate a physical address contiguity of data associated with the received logical address with data associated with a logical address in the mapping table cache, retrieving mapping data for another subset from non-volatile memory and determining a physical address for the received logical address based on the retrieved mapping data from the another subset.

10. The method of claim 1, wherein the predetermined number of contiguous equal logical length subsets per set is equal to an interleave factor of logical addresses in mapping entries of each subset.

11. The method of claim 1, wherein the predetermined number of subsets is four and for each mapping table cache entry the adjacent contiguous logical addresses comprise a contiguous logical address immediately preceding the respective one of the interleaved subset of logical addresses of the primary subset and two contiguous logical addresses immediately following the respective one of the interleaved subset of logical addresses of the primary subset.

12. A storage device comprising:
a non-volatile memory;
a volatile memory; and
a controller in communication with the non-volatile memory and the volatile memory, wherein the controller is configured to:
maintain a primary mapping table in the non-volatile memory, the primary mapping table comprising:
a logical to physical mapping of data in the non-volatile memory;
wherein the primary mapping table comprises a plurality of fixed length sets of logical address space, each set comprising a contiguous group of logical addresses and any physical addresses of data associated with the contiguous group of logical addresses;
wherein each set is further divided into a predetermined number of subsets comprising a primary subset of mapping entries and at least one other subset of mapping entries, each of the predetermined number of subsets comprising mapping entries for an interleaved group of the contiguous group of logical addresses in a set with respective physical addresses, wherein only the primary subset of each set includes, for each mapping entry, data regarding a contiguity of physical addresses between data associated with the primary subset and data associated with the at least one other subset; and copy the primary subset of mapping entries from the primary mapping table into the volatile memory as a plurality of mapping table cache entries, wherein each mapping table cache entry in the volatile memory comprises physical address information for a respective one of the interleaved subset of logical addresses of the primary subset and contiguity information relating to physical addresses of data associated with adjacent contiguous logical addresses in the at least one other subset, wherein the adjacent contiguous logical addresses comprise only one logical address from each of the at least one other subset.

13. The storage device of claim 12, wherein the controller is further configured to store trim information in the mapping table cache entry regarding at least one of the contiguous logical addresses adjacent to the respective one of the interleaved subset of logical addresses.

14. The storage device of claim 12, wherein the controller is further configured to store the portion of the primary mapping table in the volatile memory in response to detection of a trigger event in the storage device.

15. The storage device of claim 14, wherein the trigger event comprises a power up of the storage device.

16. The storage device of claim 12, wherein the portion of the mapping table is a fixed-size portion.

17. The storage device of claim 12, wherein in response to receiving a read or write command identifying logical addresses and, for each received logical address, the controller is further configured to examine the mapping table cache entries to determine logical to physical mapping to:

when the received logical address is in the interleaved subset of logical addresses in the mapping table cache, return a physical address for data associated with the received logical address without accessing the primary mapping table in non-volatile memory.

18. The storage device of claim 12, wherein the controller is further configured to, in response to receiving a read or write command identifying logical addresses and, for each received logical address, examine the mapping table cache entries in volatile memory to determine logical to physical mapping to:

when the received logical address is not in the interleaved subset of logical addresses in the mapping table cache, but contiguity information in the mapping table cache indicates a physical address contiguity of data associated with the received logical address with data associated with a logical address in the mapping table cache, determine a physical address for the received logical address based on an offset from the logical address in the mapping table cache data having physical address contiguity without accessing the primary mapping table in non-volatile memory.

19. The storage device of claim 12, wherein the controller is further configured to, in response to receiving a read or write command identifying logical addresses and, for each received logical address, examine the mapping table cache entries in volatile memory to determine logical to physical mapping to:

when the received logical address is not in the interleaved subset of logical addresses in the mapping table cache and contiguity information in the mapping table cache does not indicate a physical address contiguity of data associated with the received logical address with data associated with a logical address in the mapping table cache, retrieve mapping data for another subset from non-volatile memory and determine a physical address for the received logical address based on the retrieved mapping data from the another subset.

20. The storage device of claim 12, wherein the predetermined number of contiguous equal logical length subsets per set is equal to an interleave factor of logical addresses in mapping entries of each subset.

21. The storage device of claim 12, wherein the non-volatile memory comprises a three dimensional memory.

* * * * *